(12) United States Patent
Dufresne

(10) Patent No.: US 10,234,894 B1
(45) Date of Patent: Mar. 19, 2019

(54) IDENTIFICATION SYSTEM

(71) Applicant: EMC CORPORATION, Hopkinton, MA (US)

(72) Inventor: Daniel Dufresne, Salem, NH (US)

(73) Assignee: EMC IP Holding Company LLC, Hopkinton, MA (US)

( * ) Notice: Subject to any disclaimer, the term of this patent is extended or adjusted under 35 U.S.C. 154(b) by 239 days.

(21) Appl. No.: 15/189,462

(22) Filed: Jun. 22, 2016

(51) Int. Cl.
*G06F 1/12* (2006.01)
*G06F 1/06* (2006.01)
*G06F 1/08* (2006.01)

(52) U.S. Cl.
CPC ............... *G06F 1/12* (2013.01); *G06F 1/06* (2013.01); *G06F 1/08* (2013.01)

(58) Field of Classification Search
CPC ............................................... G06F 1/12
USPC ......................................................... 702/106
See application file for complete search history.

(56) References Cited

U.S. PATENT DOCUMENTS

| | | | | |
|---|---|---|---|---|
| 6,564,278 B1* | 5/2003 | Olson | ................... | G06F 13/409 710/300 |
| 7,818,387 B1* | 10/2010 | King | ................... | G06F 11/0766 709/208 |
| 2005/0047098 A1* | 3/2005 | Garnett | ............... | G11B 33/126 361/735 |
| 2007/0205822 A1* | 9/2007 | Jovanovich | ......... | G06F 11/2005 327/526 |
| 2017/0262012 A1* | 9/2017 | Beeke | ................... | G01R 15/04 |

* cited by examiner

*Primary Examiner* — Ricky Ngon
(74) *Attorney, Agent, or Firm* — Brian J. Colendreo; Mark H. Whittenberger; Holland & Knight LLP

(57) ABSTRACT

A signal generation circuit for producing an identification signal at a defined frequency. A frequency calibration circuit is electrically coupled to the signal generation circuit and is configured to set the defined frequency. The frequency calibration circuit includes a first calibration portion positioned on a first electrical subsystem and a second calibration portion positioned on a second electrical subsystem. An identification circuit is configured to process the identification signal to generate an identification result.

14 Claims, 4 Drawing Sheets

US 10,234,894 B1

IDENTIFICATION SYSTEM

TECHNICAL FIELD

This disclosure relates to IT components and, more particularly, to identification systems for use within IT components.

BACKGROUND

In today's IT infrastructure, high availability is of paramount importance. Specifically, critical (and sometimes non-critical) components within an IT infrastructure are often layered in redundancy. For example, primary servers may be supported by backup servers; primary switches may be supported by backup switches; primary power supplies may be supported by backup power supplies; and primary storage systems may be supported by backup storage systems.

Oftentimes, various subcomponents within these IT components need to be installed/serviced/replaced. Naturally, the more quickly and easily these subcomponents can be installed/replaced, the more cost efficient and effective the servicing of these components can be.

SUMMARY OF DISCLOSURE

In one implementation, an identification system includes a signal generation circuit for producing an identification signal at a defined frequency. A frequency calibration circuit is electrically coupled to the signal generation circuit and is configured to set the defined frequency. The frequency calibration circuit includes a first calibration portion positioned on a first electrical subsystem and a second calibration portion positioned on a second electrical subsystem. An identification circuit is configured to process the identification signal to generate an identification result.

One or more of the following features may be included. The first calibration portion may include at least one capacitive component. The second calibration portion may include at least on resistive component. The identification circuit may be configured to compare the defined frequency to a plurality of specified frequencies to generate an identification result. One of the first and second electrical subsystems may be a system board and another of the first and second electrical subsystems may be an expansion module. The identification result may identify a slot assembly within the system board. The identification result may identify a module type for the expansion module. The signal generation circuit may include a timer circuit.

In another implementation, an identification system includes a signal generation circuit for producing an identification signal at a defined frequency. A frequency calibration circuit is electrically coupled to the signal generation circuit and is configured to set the defined frequency. The frequency calibration circuit include a first calibration portion positioned on a first electrical subsystem and a second calibration portion positioned on a second electrical subsystem. The first calibration portion includes at least one capacitive component and the second calibration portion includes at least on resistive component. An identification circuit is configured to process the identification signal to generate an identification result.

One or more of the following features may be included. The identification circuit may be configured to compare the defined frequency to a plurality of specified frequencies to generate an identification result. One of the first and second electrical subsystems is a system board and another of the first and second electrical subsystems is an expansion module. The identification result may identify a slot assembly within the system board. The identification result may identify a module type for the expansion module. The signal generation circuit may include a timer circuit.

In another implementation, an identification system includes a signal generation circuit for producing an identification signal at a defined frequency. The signal generation circuit includes a timer circuit. A frequency calibration circuit electrically is coupled to the signal generation circuit and is configured to set the defined frequency. The frequency calibration circuit includes a first calibration portion positioned on a first electrical subsystem and a second calibration portion positioned on a second electrical subsystem. An identification circuit is configured to process the identification signal to generate an identification result. The identification circuit is configured to compare the defined frequency to a plurality of specified frequencies to generate an identification result.

One or more of the following features may be included. The first calibration portion may include at least one capacitive component. The second calibration portion may include at least on resistive component. One of the first and second electrical subsystems may be a system board and another of the first and second electrical subsystems may be an expansion module. The identification result may identify a slot assembly within the system board. The identification result may identify a module type for the expansion module.

The details of one or more implementations are set forth in the accompanying drawings and the description below. Other features and advantages will become apparent from the description, the drawings, and the claims.

BRIEF DESCRIPTION OF THE DRAWINGS

Like reference symbols in the various drawings indicate like elements.

DETAILED DESCRIPTION OF THE PREFERRED EMBODIMENTS

Figure 1:
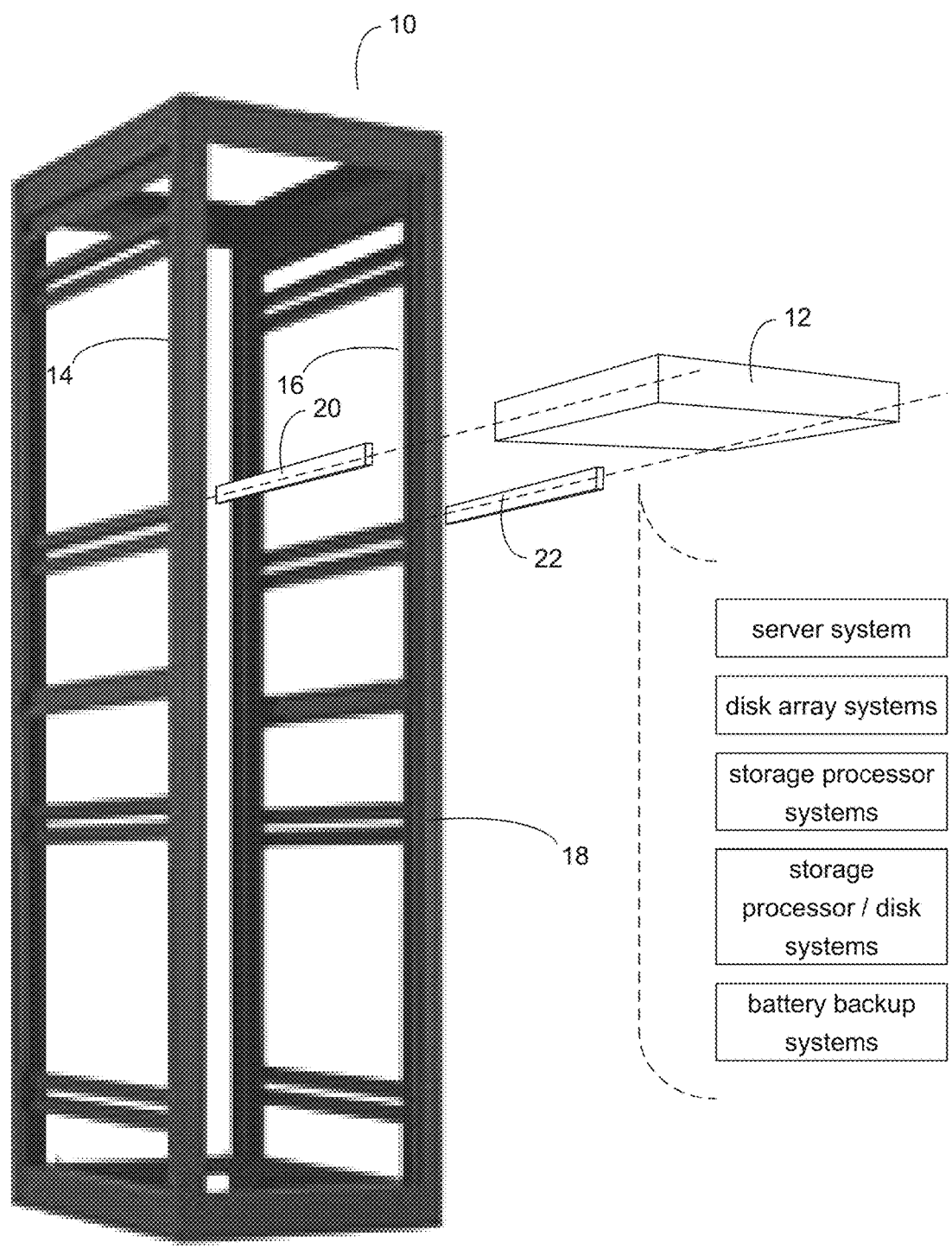
FIG. 1 is a perspective view of an IT rack and an IT component.

Referring to FIG. 1, IT racks (e.g., IT rack 10) may be utilized to store and organize IT components. For example, IT rack 10 may be placed within a computer room and various high-availability IT components (e.g., IT component 12) may be attached to rails (e.g., NEMA rails 14, 16) included within IT rack 10, wherein these rails (e.g., NEMA rails 14, 16) may have a standard and defined spacing between them (e.g., 19"). Typically, IT components that are configured to fit within IT rack 10 may be described as rack-mountable IT components.

Examples of the various IT components (e.g., IT component 12) mountable within IT rack 10 may include but are not limited to: server systems, disk array systems, storage processor systems, storage processor/disk systems, and battery backup systems.

IT rack 10 may include frame 18 (which may include one or more vertical supports, horizontal supports, and cross braces) to which NEMA rails 14, 16 may be attached. NEMA rails 14, 16 may include a plurality of evenly spaced holes that may be configured for mounting the various IT components within IT rack 10. By standardizing the spacing between NEMA rails 14, 16, the various IT devices that fit within a first IT rack may also fit within a second IT rack.

These various IT components (e.g., IT component 12) may be available in standardized heights based upon the number of rack units (U's). Examples of such standardized heights may include but are not limited to 1U IT components, 2U IT components, 3U IT components, and 4U IT components, wherein a 1U IT component is half as high as a 2U IT component, which is half as high as a 4U IT component.

IT racks (e.g., IT rack 10) may be available in various heights, which are capable of accommodating a defined number of rack units (U's). However, while the number of rack units available within a particular IT rack may be rigidly defined by the height of the IT rack, the number of IT components mountable within that IT rack may vary depending upon the height in rack units (U's) of the particular IT components being mounted within that IT rack. Therefore, by reducing the number of rack units utilized by a particular IT component within an IT rack, additional IT components may be mounted within the IT rack.

Figure 2:
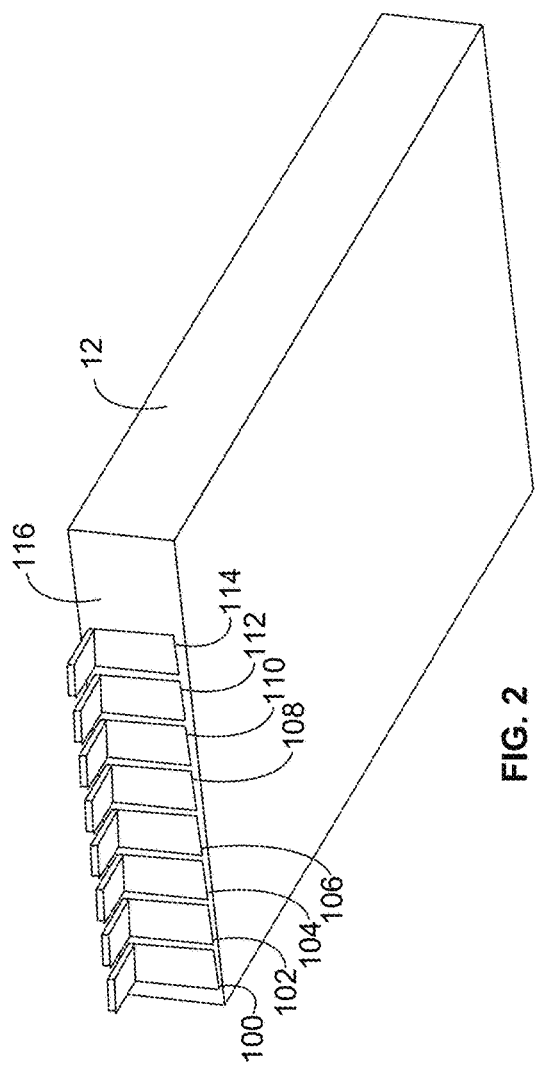
FIG. 2 is a perspective rear view of the IT component of FIG. 1.

Referring also to FIG. 2, there is shown a more detailed view of IT component 12. In this particular example, IT component 12 is shown to include a plurality of expansion modules (e.g., expansion modules 100, 102, 104, 106, 108, 110, 112, 114). While in this particular example, IT component 12 is shown to include eight expansion modules, this is for illustrative purposes only and is not intended to be a limitation of this disclosure, as the number of expansion modules included within IT component 12 may be increased or decreased depending upon need.

While, in this particular example, the plurality of expansion modules (e.g., expansion modules 100, 102, 104, 106, 108, 110, 112, 114) is shown to be accessible through a rear panel (e.g., rear panel 116) of IT component 12, this is for illustrative purposes only and is not intended to be a limitation of this disclosure, as e.g., expansion modules 100, 102, 104, 106, 108, 110, 112, 114 may be accessible through e.g., a front panel (not shown) of IT component 12 or may only be accessible internally within IT component 12 and, therefore, not accessible through any external panel of IT component 12.

Expansion modules 100, 102, 104, 106, 108, 110, 112, 114 may be hot-swappable and, therefore, configured to be installed into and removed from IT component 12 during the operation of IT component 12. As is known in the art, a device is hot-swappable when the device may be non-disruptively installed into or removed from e.g., IT component 12 (e.g., a server system, a disk array system, a storage processor system, a storage processor/disk system, and a battery backup system) while other components within IT component 12 continue to function properly.

Expansion modules 100, 102, 104, 106, 108, 110, 112, 114 may be configured to allow a user to selectively remove and add functionality and/or features to IT component 12. Examples of such functionality may include but are not limited to network connectivity functionality (i.e., a host bus adapter that allows IT component 12 to be connected a network); processor functionality (i.e., a microprocessor assembly that adds compute functionality to IT component 12); temporary storage functionality (i.e., a RAM module that adds volatile storage functionality to IT component 12); cache functionality (i.e., a flash memory module that adds flash cache functionality to IT component 12); and disk functionality (i.e., a disk module that adds disk storage functionality to IT component 12).

For the following example, expansion module 100 will be discussed. However, it is understood that the following discussion may apply to any of expansion modules 100, 102, 104, 106, 108, 110, 112, 114.

Figure 3:
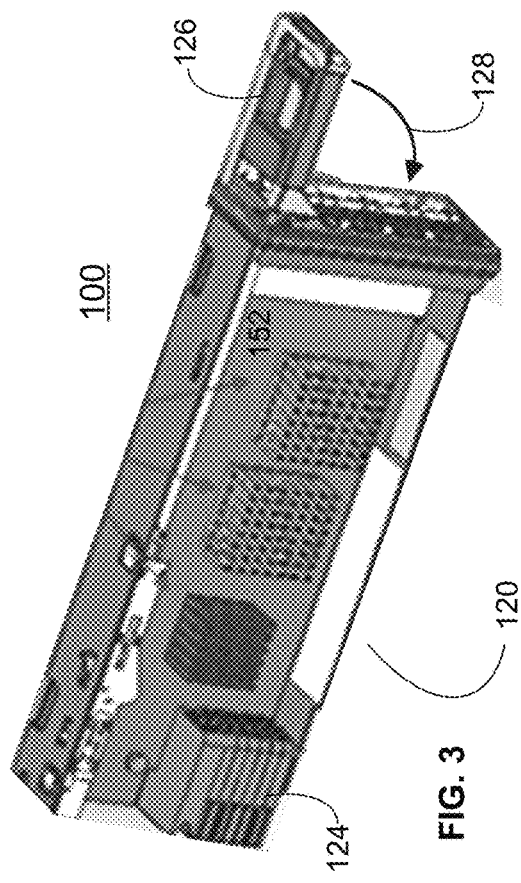
FIG. 3 is a perspective front view of an expansion module for use within the IT component of FIG. 1.

Referring also to FIG. 3, expansion module 100 may include functionality module 120. Functionality module 120 may include adapter board 122 and connector assembly 124. Expansion module 100 may also include latch assembly 126 that is configured to releasably-secure expansion module 100 within (in this example) IT component 12 (e.g., by moving latch assembly 126 in the direction of arrow 128).

First connector assembly 124 may be coupled to adapter board 122 and may be configured to releasably electrically couple adapter aboard 122 to IT component 12. As discussed above, examples of IT component 12 may include but are not limited to a portion of a data array, such as a server system, a disk array system, a storage processor system, a storage processor/disk system, and a battery backup systems.

Figure 4:
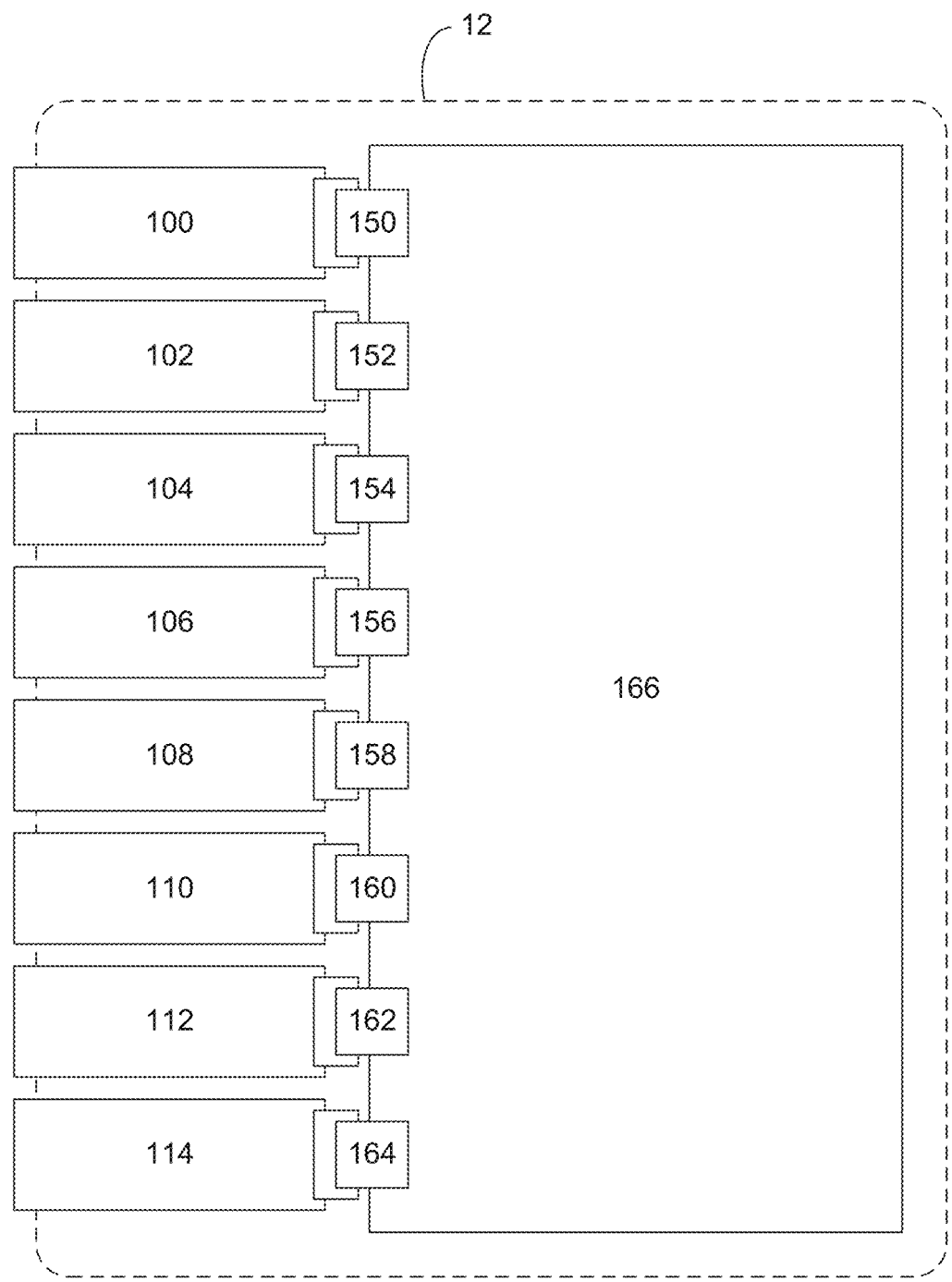
FIG. 4 is a top view of a system board and a plurality of expansion modules of FIG. 3.

Referring also to FIG. 4 and as discussed above, IT component 12 may include a plurality of expansion modules (e.g., expansion modules 100, 102, 104, 106, 108, 110, 112, 114), wherein each expansion module is connected to a slot assembly (e.g., slot assemblies 150, 152, 154, 156, 158, 160, 162, 164) within system board 166 of IT component 12. Each of slot assemblies 150, 152, 154, 156, 158, 160, 162, 164 may include an electrical connector assembly that enables the connector assembly (e.g., connector assembly 124) included within each of expansion modules 100, 102, 104, 106, 108, 110, 112, 114 to releasably engage slot assemblies 150, 152, 154, 156, 158, 160, 162, 164 (respectively), thus electrically coupling each of expansion modules 100, 102, 104, 106, 108, 110, 112, 114 to system board 166 of IT component 12. Examples of system board 166 may include but are not limited to a motherboard assembly, a processor board assembly, a backplane assembly, and a mid-plane assembly.

As discussed above, each of expansion modules 100, 102, 104, 106, 108, 110, 112, 114 may be removeably insertable into each of slot assemblies 150, 152, 154, 156, 158, 160, 162, 164. Accordingly and in order to ensure proper operation, IT component 12 may need to know the type of expansion module installed into each of slot assemblies 150, 152, 154, 156, 158, 160, 162, 164. Further and in order to ensure proper operation of each of expansion modules 100, 102, 104, 106, 108, 110, 112, 114, each expansion module may need to know which slot assembly (chosen from slot assemblies 150, 152, 154, 156, 158, 160, 162, 164) the expansion module is installed into.

Figure 5:
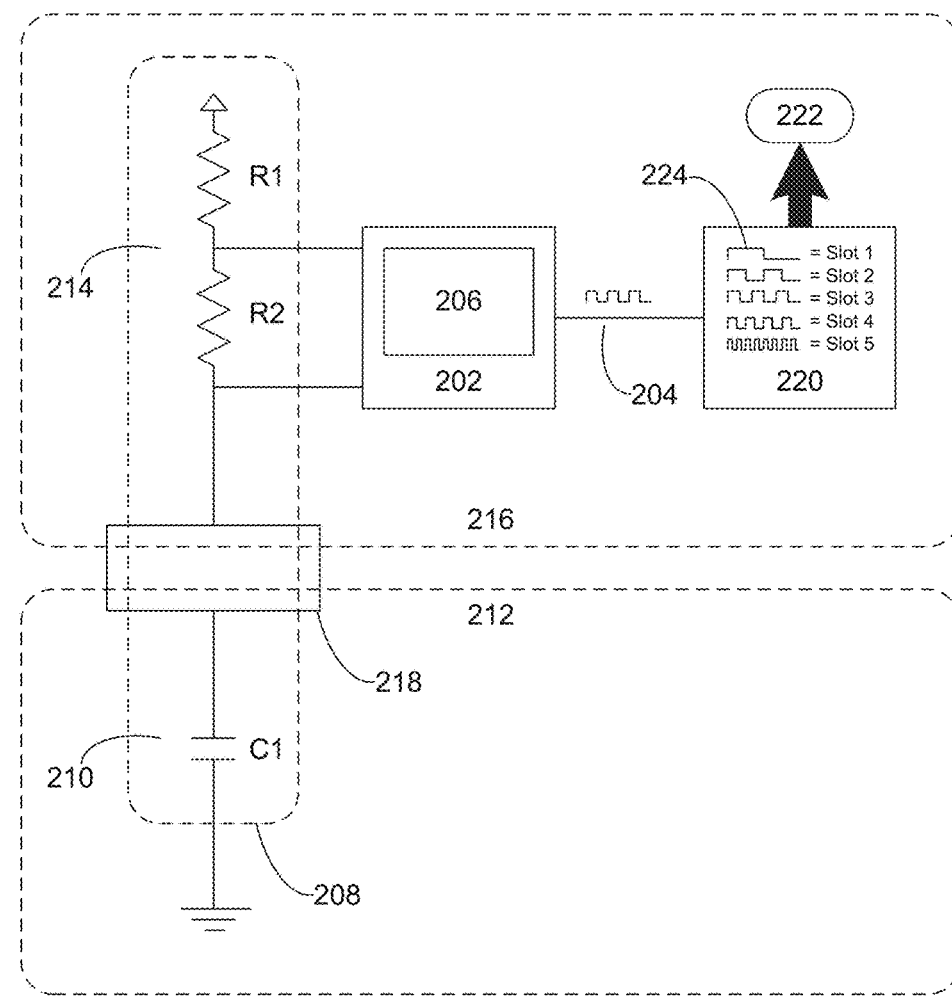
FIG. 5 is a diagrammatic view of an identification circuit for use with the system board and a plurality of the expansion modules of FIG. 3.

Accordingly and referring also to FIG. 5, identification system 200 may be utilized to allow for such identification of the expansion module type and the system board slot number, wherein identification system 200 may be configured to use a reduced number of electrical connections between system board 166 and expansion modules 100, 102, 104, 106, 108, 110, 112, 114.

Identification system 200 may include signal generation circuit 202 for producing identification signal 204 at a defined frequency (to be discussed below in greater detail).

Examples of identification signal 204 may include but are not limited to a variable frequency square wave and a variable duty-cycle pulse train.

Signal generation circuit 202 may include timer circuit 206. An example of timer circuit 206 may include but is not limited to a 555 timer (e.g., a Texas Instruments TLC555 or a Fairchild LM555) configured to operate in astable mode. As is known in the art, when a timer circuit is configured to operate in astable mode, identification signal 204 may be a pulse train (e.g., a variable frequency square wave and a variable duty-cycle pulse train); as opposed to a single binary transition (e.g., from a binary 0 to a binary 1 or from a binary 1 to a binary 0) as would occur when a timer circuit is configured to operate in stable mode.

Frequency calibration circuit 208 may be electrically coupled to signal generation circuit 202 and may be configured to set the defined frequency of identification signal 204. Frequency calibration circuit 208 may include first calibration portion 210 positioned on first electrical subsystem 212 and second calibration portion 214 positioned on second electrical subsystem 216.

An example of first calibration portion 210 may include at least one capacitive component (e.g., capacitive component C1). An example of second calibration portion 214 may include at least on resistive component (e.g., resistive components R1, R2). Examples of first electrical subsystem 212 may include but are not limited to system board 166 or an expansion module (e.g., expansion modules 100, 102, 104, 106, 108, 110, 112, 114). Further, examples of second electrical subsystem 216 may also include but are not limited to system board 166 or an expansion module (e.g., expansion modules 100, 102, 104, 106, 108, 110, 112, 114). As discussed above, first electrical subsystem 212 and second electrical subsystem 216 may be releasably coupled together via connector assembly 218, which may be e.g., a combination of the electrical connector included in each of expansion modules 100, 102, 104, 106, 108, 110, 112, 114 and the electrical connector included in each of the slot assemblies 150, 152, 154, 156, 158, 160, 162, 164.

By varying the value of R1, R2 and C1, the frequency of identification signal 204 may be varied. For example and for a frequency calibration circuit 208 in which R1 and R2 each have a value of 10,000 Ohms:

a C1 having a value of 0.000470 Farads produces identification signal 204 having a frequency of 1.023 Hertz;
a C1 having a value of 0.000220 Farads produces identification signal 204 having a frequency of 2.167 Hertz;
a C1 having a value of 0.000150 Farads produces identification signal 204 having a frequency of 3.200 Hertz;
a C1 having a value of 0.000099 Farads produces identification signal 204 having a frequency of 4.800 Hertz; and
a C1 having a value of 0.000081 Farads produces identification signal 204 having a frequency of 5.860 Hertz.

Accordingly, if the value of R1 and R2 within second calibration portion 214 positioned on second electrical subsystem 216 are maintained constant and the value of C1 within first calibration portion 210 positioned on first electrical subsystem 212 is uniquely varied, the identification of first electrical subsystem 212 may be identified.

For example, assume that IT component 12 is configured to receive five expansion modules, wherein first electrical subsystem 212 is a slot assembly (e.g., slot assemblies 150, 152, 154, 156, 158) within IT component 12. Further assume that second electrical subsystem 216 is an expansion module (e.g., expansion modules 100, 102, 104, 106, 108). Additionally assume that:

first calibration portion 210 of first electrical subsystem 212 associated with slot assembly 150 includes C1 having a value of 0.000470 Farads;
first calibration portion 210 of first electrical subsystem 212 associated with slot assembly 152 includes C1 having a value of 0.000220 Farads;
first calibration portion 210 of first electrical subsystem 212 associated with slot assembly 154 includes C1 having a value of 0.000150 Farads;
first calibration portion 210 of first electrical subsystem 212 associated with slot assembly 156 includes C1 having a value of 0.000099 Farads; and
first calibration portion 210 of first electrical subsystem 212 associated with slot assembly 158 includes C1 having a value of 0.000081 Farads.

Accordingly:

when expansion module 100 is plugged into slot assembly 150, identification signal 204 having a frequency of 1.023 Hertz will be produced by signal generation circuit 202;
when expansion module 102 is plugged into slot assembly 152, identification signal 204 having a frequency of 2.167 Hertz will be produced by signal generation circuit 202;
when expansion module 104 is plugged into slot assembly 154, identification signal 204 having a frequency of 3.200 Hertz will be produced by signal generation circuit 202;
when expansion module 106 is plugged into slot assembly 156, identification signal 204 having a frequency of 4.800 Hertz will be produced by signal generation circuit 202; and
when expansion module 108 is plugged into slot assembly 158, identification signal 204 having a frequency of 5.860 Hertz will be produced by signal generation circuit 202.

Identification circuit 220 may be configured to process identification signal 204 to generate identification result 222. Specifically, identification circuit 220 may be configured to compare the defined frequency of identification signal 204 to a plurality of specified frequencies (e.g., specified frequencies 224) to generate identification result 222, wherein each of specified frequencies 224 is associated with (in this example) a specific slot assembly within system board 166. While in this particular example, specified frequencies 224 is shown to include five results, this is for illustrative purposes only and is not intended to be a limitation of this disclosure, as the maximum quantity of specified frequencies may be increased (up to the point that the tolerance of components R1, R2 and C1 can no longer provide the required level of resolution to support the number of frequencies).

Identification result 222 may identify a slot assembly (e.g., slot assemblies 150, 152, 154, 156, 158) within system board 166. Continuing with the above stated example:

if identification signal 204 has a frequency of 1.023 Hertz, identification result 220 may indicate that the expansion module is inserted into slot assembly 150;
if identification signal 204 has a frequency of 2.167 Hertz, identification result 220 may indicate that the expansion module is inserted into slot assembly 152;
if identification signal 204 has a frequency of 3.200 Hertz, identification result 220 may indicate that the expansion module is inserted into slot assembly 154;
if identification signal 204 has a frequency of 4.800 Hertz, identification result 220 may indicate that the expansion module is inserted into slot assembly 156; and if identification signal 204 has a frequency of 5.860 Hertz, identification result 220 may indicate that the expansion module is inserted into slot assembly 158.

Identification result 220 may also identify a module type for the expansion module (e.g., expansion modules 100, 102, 104, 106, 108). For example, if first electrical subsystem 212 is an expansion module and second electrical subsystem 216 is system board 166, the component (e.g., C1) that varies in value within frequency calibration circuit 208 would be located on the expansion module (as opposed to system board 166). Accordingly, a specific frequency value may be associated with each expansion module type. For example:

- a C1 having a value of 0.000470 Farads may produce identification signal 204 having a frequency of 1.023 Hertz, which may be associated with network connectivity expansion modules;
- a C1 having a value of 0.000220 Farads may produce identification signal 204 having a frequency of 2.167 Hertz, which may be associated with processor expansion modules;
- a C1 having a value of 0.000150 Farads may produce identification signal 204 having a frequency of 3.200 Hertz, which may be associated with temporary storage expansion modules;
- a C1 having a value of 0.000099 Farads may produce identification signal 204 having a frequency of 4.800 Hertz, which may be associated with cache expansion modules; and
- a C1 having a value of 0.000081 Farads may produce identification signal 204 having a frequency of 5.860 Hertz, which may be associated with disk expansion modules.

Accordingly, by placing the appropriate value capacitor on a specific type of expansion module, identification signal 204 having the appropriate frequency may be produced, thus allowing (in this example) system board 166 to know the type of expansion module that was positioned into each slot assembly.

General:

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

A number of implementations have been described. Having thus described the disclosure of the present application in detail and by reference to embodiments thereof, it will be apparent that modifications and variations are possible without departing from the scope of the disclosure defined in the appended claims.

What is claimed is:

1. An identification system comprising:
   a signal generation circuit for producing an identification signal at a defined frequency;
   a frequency calibration circuit electrically coupled to the signal generation circuit and configured to set the defined frequency, wherein the frequency calibration circuit includes:
   a first calibration portion positioned on a first electrical subsystem, and
   a second calibration portion positioned on a second electrical subsystem; and
   an identification circuit configured to process the identification signal to generate an identification result when the first electrical subsystem is electrically coupled to the second electrical subsystem, wherein one of the first and second electrical subsystems is a system board and another of the first and second electrical subsystems is an expansion module, wherein the identification result identifies a module type from a plurality of module types for the expansion module.

2. The identification system of claim 1 wherein the first calibration portion includes at least one capacitive component.

3. The identification system of claim 1 wherein the second calibration portion includes at least on resistive component.

4. The identification system of claim 1 wherein the identification circuit is configured to compare the defined frequency to a plurality of specified frequencies to generate an identification result.

5. The identification system of claim 1 wherein the identification result identifies a slot assembly within the system board.

6. The identification system of claim 1 wherein the signal generation circuit includes a timer circuit.

7. An identification system comprising:
   a signal generation circuit for producing an identification signal at a defined frequency;
   a frequency calibration circuit electrically coupled to the signal generation circuit and configured to set the defined frequency, wherein the frequency calibration circuit includes:
   a first calibration portion positioned on a first electrical subsystem, and
   a second calibration portion positioned on a second electrical subsystem,
   wherein the first calibration portion includes at least one capacitive component and the second calibration portion includes at least on resistive component; and
   an identification circuit configured to process the identification signal to generate an identification result when the first electrical subsystem is electrically coupled to the second electrical subsystem, wherein one of the first and second electrical subsystems is a system board and another of the first and second electrical subsystems is an expansion module, wherein the identification result identifies a module type for the expansion module.

8. The identification system of claim 7 wherein the identification circuit is configured to compare the defined frequency to a plurality of specified frequencies to generate an identification result.

9. The identification system of claim 7 wherein the identification result identifies a slot assembly within the system board.

10. The identification system of claim 7 wherein the signal generation circuit includes a timer circuit.

11. An identification system comprising:
  a signal generation circuit for producing an identification signal at a defined frequency, wherein the signal generation circuit includes a timer circuit;
  a frequency calibration circuit electrically coupled to the signal generation circuit and configured to set the defined frequency, wherein the frequency calibration circuit includes:
    a first calibration portion positioned on a first electrical subsystem, and
    a second calibration portion positioned on a second electrical subsystem; and
  an identification circuit for processing the identification signal to generate an identification result when the first electrical subsystem is electrically coupled to the second electrical subsystem, wherein the identification circuit is configured to compare the defined frequency to a plurality of specified frequencies to generate an identification result, wherein one of the first and second electrical subsystems is a system board and another of the first and second electrical subsystems is an expansion module, wherein the identification result identifies a module type for the expansion module.

12. The identification system of claim 11 wherein the first calibration portion includes at least one capacitive component.

13. The identification system of claim 11 wherein the second calibration portion includes at least on resistive component.

14. The identification system of claim 11 wherein the identification result identifies a slot assembly within the system board.

\* \* \* \* \*